United States Patent
Natarajan et al.

(10) Patent No.: US 11,783,893 B2
(45) Date of Patent: Oct. 10, 2023

(54) UTILIZING NAND BUFFER FOR DRAM-LESS MULTILEVEL CELL PROGRAMMING

(71) Applicant: Intel Corporation, Santa Clara, CA (US)

(72) Inventors: Shankar Natarajan, Folsom, CA (US); Suresh Nagarajan, Folsom, CA (US); Aliasgar S. Madraswala, Folsom, CA (US); Yihua Zhang, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/133,459

(22) Filed: Dec. 23, 2020

(65) Prior Publication Data

US 2021/0151098 A1    May 20, 2021

(51) Int. Cl.
*G11C 7/10* (2006.01)
*G11C 11/56* (2006.01)
*G11C 29/42* (2006.01)

(52) U.S. Cl.
CPC ........ *G11C 11/5628* (2013.01); *G11C 7/1039* (2013.01); *G11C 11/5642* (2013.01); *G11C 29/42* (2013.01)

(58) Field of Classification Search
CPC ..... G11C 16/0483; G11C 16/06; G11C 16/10; G11C 16/26; G11C 14/0054; G11C 14/0063
See application file for complete search history.

(56) References Cited

U.S. PATENT DOCUMENTS

| | | |
|---|---|---|
| 9,093,170 B2 | 7/2015 | Motwani |
| 9,870,169 B2 | 1/2018 | Ramalingam et al. |
| 10,061,516 B2 | 8/2018 | Wakchaure et al. |
| 10,120,751 B2 | 11/2018 | Khan et al. |
| 10,175,903 B2 | 1/2019 | Madraswala et al. |
| 10,379,782 B2 | 8/2019 | Nagarajan et al. |
| 2014/0006688 A1 | 1/2014 | Yu et al. |
| 2014/0281124 A1 | 9/2014 | Veal |

(Continued)

FOREIGN PATENT DOCUMENTS

| | | |
|---|---|---|
| WO | 2016053736 A1 | 4/2016 |
| WO | 2020132848 A1 | 7/2020 |

OTHER PUBLICATIONS

Kim et al. "HMB in DRAM-less NVMe SSDs: Their usage and effects on performance," Mar. 2, 2020, PLOS One, pp. 1-15 (Year: 2020).*

(Continued)

*Primary Examiner* — Alfredo Bermudez Lozada
(74) *Attorney, Agent, or Firm* — Compass IP Law PC

(57) ABSTRACT

Programming a multilevel cell (MLC) nonvolatile (NV) media can be performed with internal buffer reuse to reduce the need for external buffering. The internal buffer is on the same die as the NV media to be programmed, along with a volatile memory to store data to program. The internal buffer is to read and program data for the NV media. Programming of the NV media includes staging first partial pages in the buffer for program, reading second partial pages from the NV media to the volatile memory, storing second partial pages in the buffer, and programming the NV media with the first partial pages and the second partial pages.

20 Claims, 9 Drawing Sheets

(56) References Cited

U.S. PATENT DOCUMENTS

| | | |
|---|---|---|
| 2019/0042146 A1 | 2/2019 | Wysoczanski et al. |
| 2019/0146913 A1 | 5/2019 | Trika |
| 2019/0347044 A1 | 11/2019 | Kim |
| 2019/0361614 A1* | 11/2019 | Natarajan ............. G06F 3/0679 |
| 2020/0133563 A1* | 4/2020 | Springberg ......... G06F 12/0246 |
| 2020/0133898 A1 | 4/2020 | Therene et al. |
| 2021/0241819 A1* | 8/2021 | Inbar ..................... G11C 16/10 |

OTHER PUBLICATIONS

Extended European Search Report for Patent Application No. 21198387.9, dated Mar. 18, 2022, pages.

* cited by examiner

UTILIZING NAND BUFFER FOR DRAM-LESS MULTILEVEL CELL PROGRAMMING

FIELD

Descriptions are generally related to nonvolatile memory, and more particular descriptions are related to programming a multilevel cell nonvolatile memory.

BACKGROUND

Nonvolatile storage or nonvolatile memory is used for mass storage in computing devices and gaming systems. Nonvolatile storage refers to storage that retains a determinate state even if power is interrupted to the memory. Devices continue to increase in storage space as demand increases. Increased capacity has been achieved by increased data density, with multilevel cells replacing single level cells (SLC). The multilevel cells can includes 2, 3, 4, or even 5 bits per cell.

Multilevel cells are slower to program than SLC. Programming for multilevel cells is typically aided by a volatile memory. However, adding a volatile memory device for programming the nonvolatile storage increases the cost of a nonvolatile storage device. For example, QLC (quad level cell) programming involves programming four pages of data, which is traditionally cached in a DRAM (dynamic random access memory) device that could be as large as 4 MB (megabyte) for a 2 TB (terabyte) drive.

DRAM-less storage devices exist for three-level cells (TLC), which have an on-die volatile buffer of approximately 256 KB (kilobyte) to 384 KB. However, a QLC device would require a significantly larger volatile buffer to implement programming with a volatile buffer, which would require approximately 1-4 MB of memory. It is prohibitive in terms of cost and die area to include 1-4 MB of volatile memory.

An alternative to providing the buffer on the nonvolatile die, the system can utilize memory space in system main memory as a programming data cache. Using system memory as a data cache requires access to the cache through the host memory bus, which would involve a significant performance penalty to share host bandwidth. Additionally, programming for a garbage collection routine is not feasible with the host memory bus, seeing that the communication bus will transition to a low power state during the times that garbage collection would be performed. Neither the use of high capacity on-die volatile storage, nor the use of the host memory bus to access main memory are scalable solutions for nonvolatile devices with increasing capacities.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
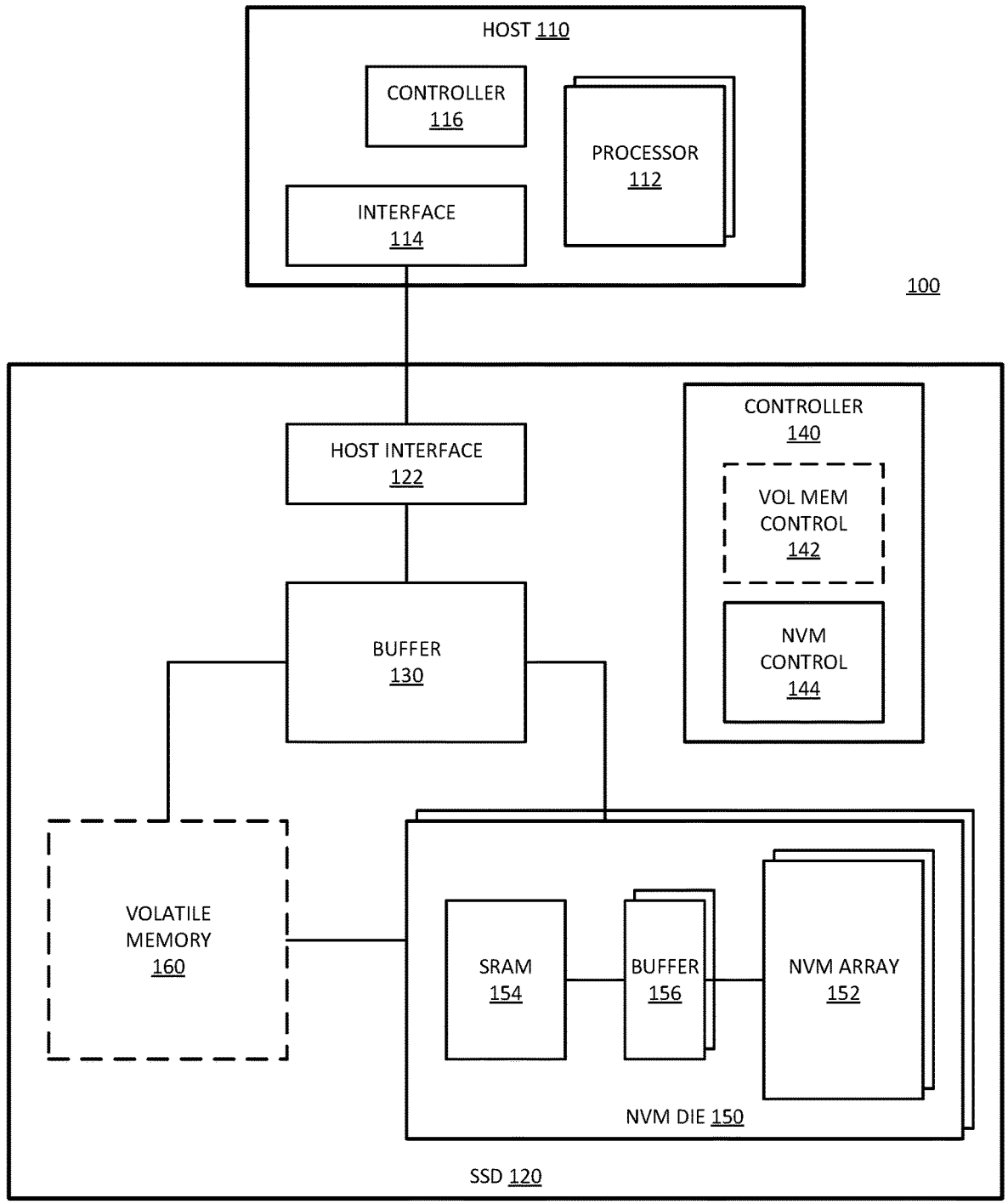
FIG. 1 is a block diagram of an example of a system with a solid state drive.

Descriptions of certain details and implementations follow, including non-limiting descriptions of the figures, which may depict some or all examples, and well as other potential implementations.

DETAILED DESCRIPTION

As described herein, a multilevel cell (MLC) nonvolatile (NV) media can be programmed with internal buffer reuse to reduce the need for external buffering. The internal buffer is on the same die as the NV media to be programmed, along with a volatile memory to store data to program. The internal buffer is to read and program data for the NV media. Programming of the NV media includes staging first partial pages in the buffer for program, reading second partial pages from the NV media to the volatile memory, storing second partial pages in the buffer, and programming the NV media with the first partial pages and the second partial pages.

Programming with the internal buffer as described provides a scalable solution with no additional volatile memory space needed, whether on-die memory (such as SRAM (synchronous random access memory)) or off-die memory (such as DRAM (dynamic random access memory)), and does not cause negatively impact performance. The programming is scalable because it can use internal buffer space already available, repurposed with a different programming operation. The programming with the internal buffers to buffer the write data can be applied to DRAM-less SSDs (solid state drives).

In one example, programming with the internal buffer enables programming a DRAM-less QLC NAND SSD, despite the additional programming stage needed (QLC has programming A and B, whereas TLC (three level cell or triple level cell) has programming A only). TLC NAND SSD garbage collection can include an ASIC SRAM buffer of approximately 256 KB to 384 KB, which is sufficient for a QLC SSD with quad-plane NAND die and 4-channel controller, when the internal buffer is appropriately utilized.

As a specific example, consider a storage device, such as an SSD, which uses QLC (quad level cell) NAND. NAND-based nonvolatile memory is commonly referred to as flash memory. QLC flash includes internal latches or registers that operate as an internal buffer to move data into and out of the nonvolatile QLC memory array. The internal registers are typically utilized for NAND internal operations. In one example, firmware in the media controller can repurpose the internal register for system purposes, to retain the data needed to perform programming of the NAND flash array. In one example, the SSD firmware performs QLC programming and garbage collection with the internal buffer. Use of the internal buffer in programming the QLC NAND flash does not have a power penalty during idle garbage collection.

The programming can enable a DRAM-less solution with lower SRAM footprint on the ASIC (application specific integrated circuit) controller for the flash memory. The solution lowers cost and power for systems that deploy it, such as hybrid SSDs, including hybrid SSDs that utilize QLC NV media and 3DXP (three dimensional crosspoint) write buffering media.

FIG. 1 is a block diagram of an example of a system with a solid state drive. System 100 includes host 110 coupled to solid-state drive (SSD) 120. Host 110 represents a computing system platform that stores data in SSD 120. SSD 120 represents a storage device for system 100. The computing system platform can be, for example, a laptop, a gaming system, a tablet or other handheld system, or other computing system.

Host 110 includes processor 112, which represents a host processor or primary processor for the computing device of system 100. Processor 112 can be any type of processor, such as central processing unit (CPU) system on a chip (SOC), a graphics processing unit (GPU), or other processor or controller that performs operations that trigger access to the storage resource on SSD 120.

Host 110 includes interface 114, which represents an interface to access SSD 120. Interface 114 can include hardware such as signal lines, driver, receivers, or other hardware to communicate with SSD 120. SSD 120 includes host interface 122 to communicate with host 110. In one example, interface 114 and host interface 122 can communicate via a Nonvolatile Memory Express (NVMe) standard. NVMe standards define a register level interface for host software to communicate with an SSD over Peripheral Component Interconnect Express (PCIe), a high-speed serial computer expansion bus. NVM Express standards are available at www.nvmexpress.org. PCIe standards are available at pcisig.com.

In one example, host 110 includes controller 116, which represents a host-side controller to manage access by the host to SSD 120. Controller 116 can manage interface 114 to enable host 110 to communicate with SSD 120. Controller 116 receives requests from processor 112 or another component on host 110 for data stored on SSD 120. The request can be a read request to access data at a specific location, or a write or program request to send data to SSD 120 for storage.

In one example, SSD 120 includes controller 140, which represent a storage-side controller to manage host interface 122 and generate internal operations to respond to requests from host 110. Controller 140 represents a controller for the SSD device itself, and can control access to NVM (nonvolatile memory) die 150 and volatile memory 160. In one example, SSD 120 could include volatile memory 160 as an internal cache for program or write operations to improve the program time between buffer 130 and NVM die 150. With the program operation herein, volatile memory 160 can be eliminated from SSD 120. If SSD 120 includes volatile memory 160, controller 140 can include volatile memory (vol mem) control 142 to manage access to the volatile memory device. Controller 140 includes NVM control 144 to manage access to NVM die 150.

In one example, SSD 120 includes buffer 130 as a write buffer or write cache to cache write data sent to SSD 120. In one example, buffer 130 can represent a read buffer to hold frequently accessed data in a storage medium that has fast access. Buffer 130 is smaller in storage capacity than NVM die 150 but has faster access time than NVM die 150.

In one example, buffer 130 is a region on NV die 150. For example, NVM die 150 can include a large QLC storage array as the primary storage and a smaller SLC storage array as a cache. Data can be written first to buffer 130 or an SLC region for faster write time to improve write time for SSD 120 than would be achieved writing directly to a QLC or other multilevel cell region. The data can then be transferred to the multilevel cell region through garbage collection operation, which refers to a background process to move data between Controller 140 represents an off-die control with respect to NVM die 150. NVM die 150 can include an on-die controller to manage operations within the NVM die, which would be separate from controller 140. Controller 140 can queue and process commands, for example, read, write or program, or erase commands for the NVM die 150, and read and write commands for volatile memory 160.

SSD 120 includes one or multiple NVM dies 150. The details of a single die are illustrated in system 100. In one example, NVM die 150 is a multiplane die with separate channels of storage to improve the bandwidth of data access.

NVM die 150 includes NVM array 152, which represents the storage media for SSD 120. In one example, NVM die 150 includes buffer 156, which can represent registers or flip flops within NVM die 150 as a buffer to interface with NVM array 152. NVM array 152 can be implemented as any memory media that writes data in multilevel cells, such as TLC, QLC, 5LC, or an MLC implementation of 3DXP, as long as the NVM array has an internal buffer to implement the program operations described. With the internal buffer 156, the write operation is self-contained within NVM die 150, and there is not a requirement for cache resources outside the NVM die to perform a data transfer and programming of the MLC cells.

In one example, NVM die 150 includes SRAM (static random access memory) 154 as a volatile memory buffer within the die to implement caching for the programming operations. For the programming operations, SRAM 154 can include a block of data to write to NVM array 152, and buffer 156 includes space for a small number of pages to time the read from or write to NVM array 152. Thus, SRAM 154 and buffer 156 can provide caching or buffering for the programming operations, where use of buffer 156 can provide a place to hold the data for a program operation while SRAM 154 is loaded with other data to complete the full write.

Known QLC SSDs have an "SLC first" architecture, where host data is written to NAND in SLC mode and later rewritten to NAND in QLC mode during a garbage collection background process. In one example, QLC NAND has a 2-step or 2-stage programming sequence, the first stage to write 4 states, and the second stage to write 16 states. In one example, the second stage write involves prereading the first stage data from the NAND.

Garbage collection in SSD 120 involves moving valid data from a source memory (such as buffer 130, which can be another NAND block or other media), collating the valid data, and writing it to the destination NAND block of NVM array 152. Buffer 156 can be a read/write buffer. For normal read or write operation, the contents of the data registers or storage media of buffer 156 can be overwritten for normal operation. In one example, NVM die 150 is configured to preserve the data through subsequent read operations, until the data is programmed to NVM array 152.

In one example, collating the valid data includes writing a first portion of data to buffer 156 and leaving it in buffer 156 while other portions of the data are read to a volatile media, such as SRAM 154. In one example, the read to SRAM 154 or volatile memory can include the execution of ECC (error checking and correction) on the data. Thus, the data can be error corrected before being written to NVM array 152. The other portions of data can also be written to buffer 156, and then all the data can be written to NVM array 152 from buffer 156.

For purposes of garbage collection, buffer 130 can be a source media or a source memory device to provide data to write to NVM array 152. In one example, buffer 130 includes SLC flash. In one example, buffer 130 includes 3DXP. In one example, the programming with buffer 156 can be performed between other memory media and NVM array 152. For example, the source media for the programming can be a volatile buffer of DRAM (e.g., if volatile memory 160 is used in SSD 120), a nonvolatile media such as a TLC, a different QLC array, a 5LC (five level cell), or other media.

Figure 2:
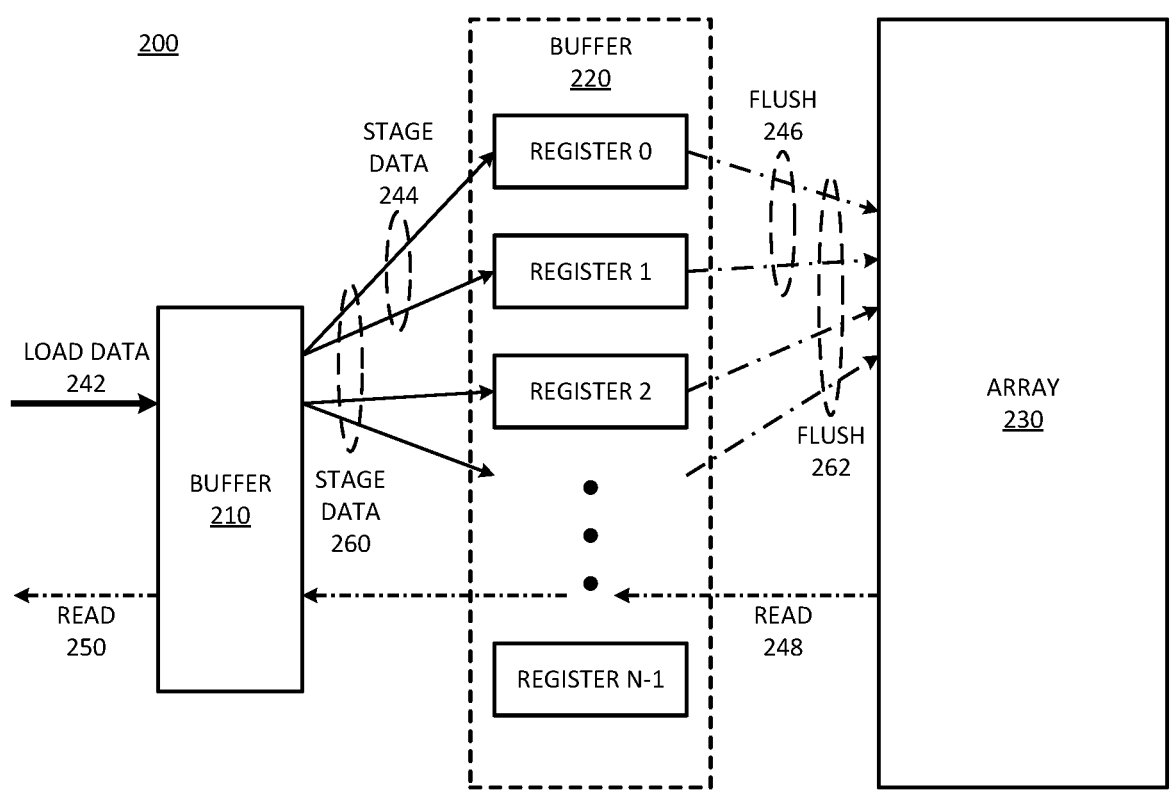
FIG. 2 is a block diagram of an example of a nonvolatile die with a multistage program.

FIG. 2 is a block diagram of an example of a nonvolatile die with a multistage program. System 200 represents a nonvolatile die in accordance with an example of NVM die 150 of system 100. System 200 includes array 230, buffer 210, and buffer 220.

In one example, array 230 is a NAND array that can operate in SLC mode or MLC mode. In SLC mode, array 230 can store a single bit of data (a binary bit) in per memory cell. In multilevel cell mode, array stores multiple bits of data by storing data as one of multiple levels of voltage stored in the cell. In one example, array 230 is another nonvolatile media that can store data in a binary mode or a multilevel cell mode. Array 230 is a destination storage device for a program or write operation in MLC mode. In one example, array 230 can be a source in SLC mode.

Buffer 210 represents a volatile memory buffer. In one example, buffer 210 is an SRAM memory on-die with array 230. In one example, buffer 210 is a DRAM array. Buffer 210 can be a buffer interface to storage media off the die of array 230.

Buffer 220 represents a read/write buffer for array 230. For read operations, buffer 220 stores data for reading to buffer 210. For write operations, buffer 220 can be a staging buffer to load the data to program array 230. In one example, buffer 220 preserves write data through subsequent array read operations and SLC/QLC mode switching operations.

While not specifically shown, array 230 stores data as blocks of data, where a block includes multiple pages of data. A page of data includes multiple bits of data and associated metadata. For example, an array can include 2K (2048) blocks, each having 64 pages of 2K bytes of data (and 64 bytes of metadata). Reference to reading data and writing data is done by pages and blocks.

In one example, system 200 implements a QLC write algorithm and page sequence as follows. In a first write stage or program stage, the controller (not specifically shown) writes 2 pages of WL (wordline) N. In a second write stage or program stage, the controller writes another 2 pages of data. In one example, the second stage writes data from a different wordline, in a staircase fashion. Staggering of the wordline can improve the read window budget for a QLC device, allowing for faster programming. The time delay required for sequential program operations to different wordlines is shorter than the time delay required for sequential program operations to the same wordline. Thus, by implementing writes in a staircase fashion, writing to one WL on the first program stage and to a different wordline in the second stage, the overall programming operation is faster.

In one example, the controller writes 2 pages of WL N−2 during the second stage. In one example, the controller can write 2 pages of WL N−1. It has been observed that writing to an address more than one hop away can result in improved write performance and fewer errors. Thus, the programming can, for example, write to WL N, WL N−2, WL N+1, WL N−1, and so forth. In one example, the second stage program can include reading the 2 pages previously programmed during the first stage of program to the wordline to be written. In one example, the system performs ECC on the read data, and then resends the data pattern along with 2 new pages to be programmed.

In one specific example of writing data to array 230, consider a garbage collection procedure where data is written, for example, from an SLC NAND device to a QLC NAND device. Thus, array 230 can represent a QLC NAND device to write data from an SLC NAND device (not shown).

The operation can start with loading data, illustrated by load data 242, into buffer 210 from the SLC NAND. In one example, buffer 210 represents a static data cache (SDC), which represents a buffer external to array 230. In one example, buffer 210 stages a first portion of data, stage data 244, into buffer 220. For a write from SLC to QLC, in one example, the first portion is 2 pages of data. The first portion of data can be referred to as first partial pages, referring to the fact that the portion is only a part of the total pages to be written to array 230. Thus, system 200 illustrates two lines, each line to represent a page of data, one between buffer 210 and Register 0 of buffer 220, and one between buffer 210 and Register 1 of buffer 220. In one example, the pages are loaded into buffer 220 one at a time.

In one example, buffer 220 represents a programmable data cache (PDC), where the N registers (Register[0:(N−1)]) represent the buffer hardware associated with array 230 to program the array. In one example, a media controller controls flush 246 of the first portion of data from Register 0 and Register 1 to array 230. The loading of the data to the first flush 246 can be considered the first stage of the program operation for array 230.

In one example, additional data, a second portion of data (e.g., another 2 pages of data) or second partial pages, can be loaded into buffer 210. The second portions of data can be staged into buffer 220, as illustrated at stage data 260. For the first part of the operation, data can be loaded into Register 2 and another register (for example, Register 3, although there is not a requirement that data be loaded into sequential registers or address locations of buffer 220.

In one example, the controller reads the first portion of data from array 230, as illustrated by read 248. Read 248 reads data from array 230 into registers of buffer 220. In one example, system 200 can provide the read data to a device outside of system 200, as represented by read 250. Read 250 reads the data from buffer 210 t0 another part of the computer system of which system 200 is a part.

In one example, the controller maintains the data in Register 2 and the other register while the read occurs of the other data. In one example, system 200 performs ECC on the read data and stores the data or corrected data in buffer 210. Buffer 210 can then stage the read data into buffer 220. In one example, the data is illustrated as being staged into Register 0 and Register 1, as illustrated by stage data 260. It will be understood that other registers or address space of buffer 220 can be used to stage the updated first portion of the data.

In one example, the controller flushes both portions of the data to array 230, as illustrated by flush 262. Regardless of the specific locations within buffer 220 that the data is stored, in general it can be understood that the controller manages the reading and the storing of the data to buffer 220 to perform programming without use of an external buffer.

In one example, the controller resets buffer 220 in response to loading of new data into buffer 210. The loading of the new data can be controlled to retain data for use in programming array 230. In one example, the data to be retained can include data for different wordlines if system 200 programs in a staircase fashion. In one example, the controller performs the flush when a new address is loaded into buffer 210 to signal that an operation is occurring on a different portion of the data.

In one example, an upper page triggers a flush of data. In one example, controller can issue a flush in response to an upper page being loaded. Thus, in response to a new address being loaded for programming, system 200 can flush the two portions of data to program a full portion of data to array 230. In one example, system 200 supports an explicit flush command or instruction from an off-die media controller. Thus, in response to a flush command, system 200 can flush the two portions of data to program a full portion of data to array 230.

Figure 3:
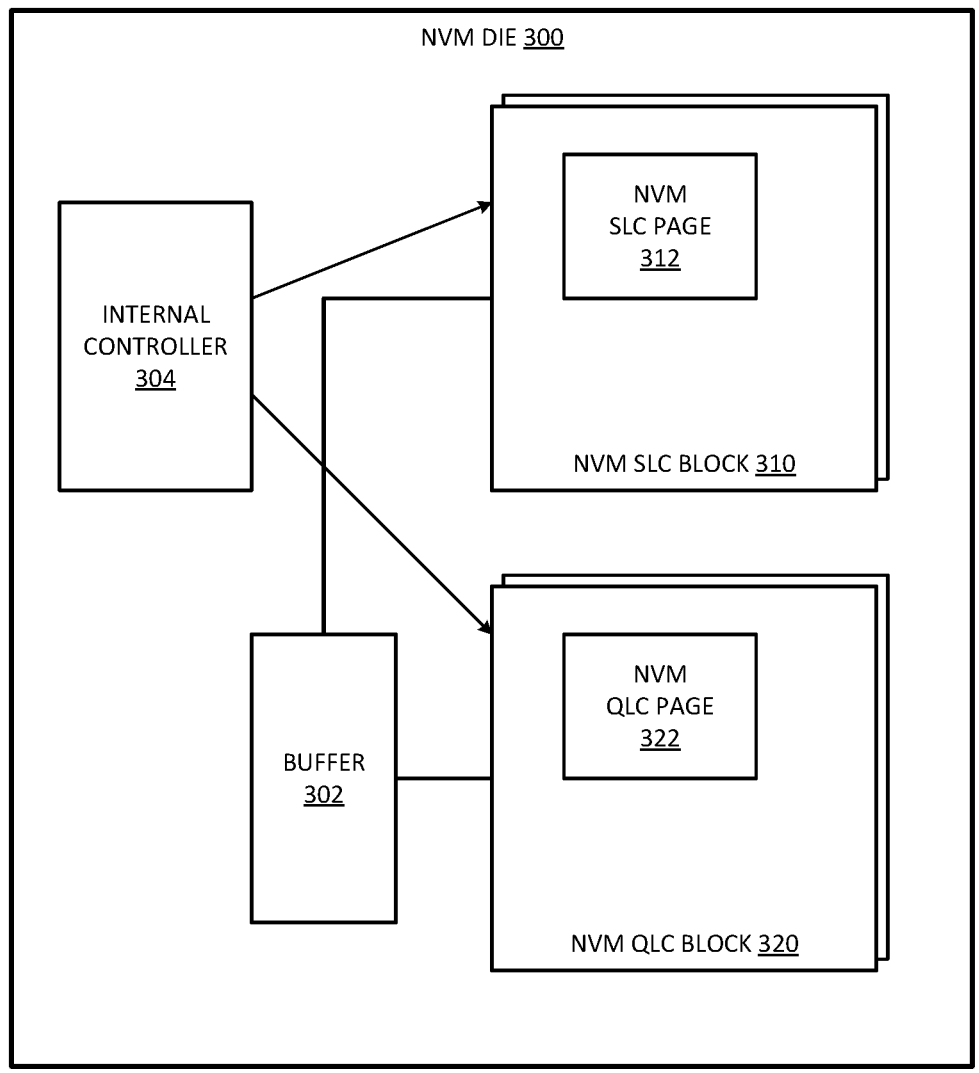
FIG. 3 is a block diagram of an example of a nonvolatile die with SLC and QLC storage.

FIG. 3 is a block diagram of an example of a nonvolatile die with SLC and QLC storage. NVM die 300 represents a nonvolatile die in accordance with an example of NVM die 150 of system 100 or an example of system 200.

NVM die 300 includes buffer 302, which represents an internal buffer of NVM QLC block 320. NVM die 300 utilizes buffer 302 to program NVM QLC block 320 without needing to go outside the NVM die for buffering or caching the data to collate the QLC write data. Buffer 302 enables NVM die 300 to write data from NVM SLC block 310 to NVM QLC block 320, for example, as part of an internal copy from a block configured in SLC mode to a block configured in QLC mode.

NVM SLC block 310 represents the block configured in SLC mode and NVM QLC block 320 represents the block configured in QLC mode. NVM SLC page 312 represents one or more pages of SLC data. NVM QLC page 322 represents one or more pages of QLC data. Four NVM SLC blocks 310 can be stored in one NVM QLC block 320 with four NVM SLC pages 312 stored in one NVM QLC page 322.

Internal controller 304 represents a controller or media controller internal to NVM die 300. In one example, internal controller 304 manages the transfer of data from NVM SLC block 310 to NVM QLC block 320. In one example, internal controller 304 executes firmware that controls garbage collection from NVM SLC block 310 to NVM QLC block 320. Internal controller 304 can control data transfer into and out of buffer 302, including holding write data in the buffer to stage the data for collating with other write data for a write to or program of NVM QLC block 320. In one example, internal controller 304 manages the copying of four NVM SLC blocks 310 selected in NVM die 300, including temporarily storing the data in buffer 302 prior to writing to NVM QLC block 320.

Figure 4:
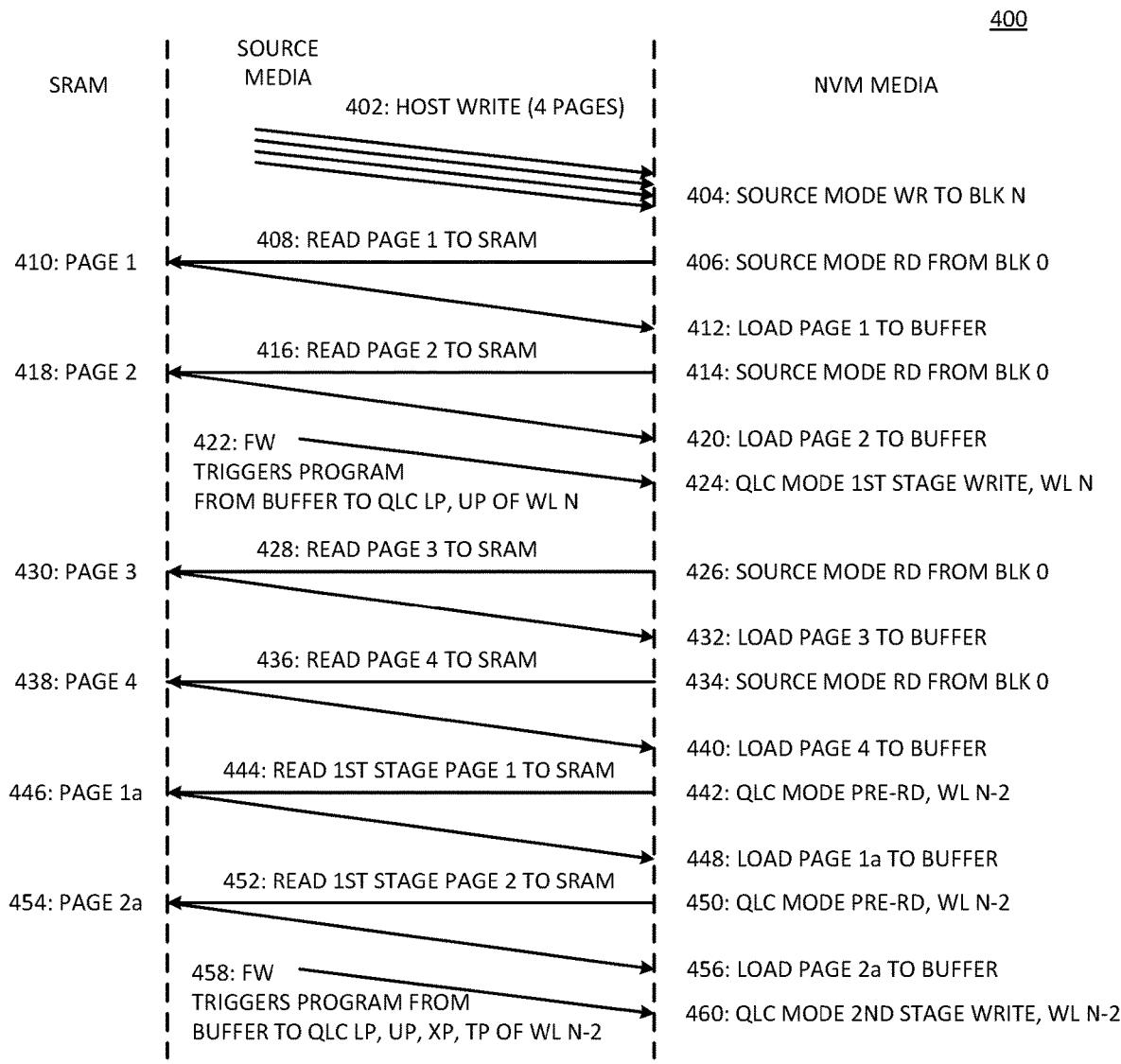
FIG. 4 is a swimlane diagram of an example of a multistage program operation for a multilevel cell nonvolatile memory.

FIG. 4 is a swimlane diagram of an example of a multistage program operation for a multilevel cell nonvolatile memory. Programming 400 illustrates a multistage operation that can be executed by an example of system 200 or NVM die 300. The programming illustrated can be an example of programming 2 bits for two pages or a first pass or a first stage of the programming, followed by programming 2 more bits for two more pages for a second pass or second stage. The programming can be controlled and operated by an internal controller on the NVM die to be programmed, which includes source and destination media.

In one example, QLC SSDs have a frontend SLC write buffer and all host data goes through the SLC buffer before being rewritten to QLC. In one example, the SLC to QLC move can be designed as a FIFO approach (first in, first out). In one example, the SLC to QLC move can be designed as a LIFO approach (last in, first out). In one example, the SLC to QLC move can be designed as a validity approach.

The description below assumes a FIFO approach. The below description assumes that the smallest atomic unit is 4 pages of host writes to SLC and 4 pages of background move from SLC to QLC. Thus, the controller can include a write pointer to a top of a stack and a read pointer to a bottom of the stack. Thus, the operation will write to N and read and move data from 0.

Programming 400 illustrates the operations occurring from the source media and the controller (identified as the firmware or FW), the SRAM as a volatile buffer, and the NVM media. In one example, the NVM media has a source mode for the NVM media. In one example, the source mode is an SLC mode where the data is first written to SLC as a write cache. In one example, the host write to the source mode involves other operations to store the host write data into a different source NVM media to transfer to a QLC mode media, such as QLC to QLC, TLC to QLC, two-level cell (sometimes abbreviated as MLC, which is used herein more generically as any cell to store more than one bit of data).

In one example, at 402, the host writes 4 pages from the source media to the destination media. At 404, the programming performs a source mode write (WR) to block (BLK) N of the source media. At 406, the programming performs a source mode read (RD) from block (BLK) 0. It will be understood that a write can occur to BLK N while garbage collection writes from the source BLK 0 to the QLC mode BLK N, where writes occur to the highest address of a stack, and reads for transfer occur from the lowest address of the stack.

At 408, the read from the source mode is specified as a read of Page 1 to the SRAM. At 410, the SRAM stores Page 1. At 412, the SRAM stages Page 1 for write, and the NVM media loads Page 1 to the internal buffer. At 414, the programming performs a source mode read (RD) from block (BLK) 0. At 416, the read from the source mode is specified as a read of Page 2 to the SRAM. At 418, the SRAM stores Page 2. At 420, the SRAM stages Page 2 for write, and the NVM media loads Page 2 to the internal buffer.

In one example, at 422, the firmware (FW) triggers a program from the internal buffer to the QLC mode media. At 424, the programming performs a QLC mode first stage write to WL N. The program will be the lower pages, LP and UP, of WL N of the QLC mode media.

At 426, the programming performs a source mode read (RD) from block (BLK) 0. At 428, the read from the source mode is specified as a read of Page 3 to the SRAM. At 430, the SRAM stores Page 3. At 432, the SRAM stages Page 3 for write, and the NVM media loads Page 3 to the internal buffer. At 434, the programming performs a source mode read (RD) from block (BLK) 0. At 436, the read from the source mode is specified as a read of Page 4 to the SRAM. At 438, the SRAM stores Page 4. At 440, the SRAM stages Page 4 for write, and the NVM media loads Page 4 to the internal buffer.

In one example, the final programming of the QLC media occurs with Page 3 and Page 4 that have been loaded into the internal buffer for a different wordline, and the data from Page 1 and Page 2 that are read back out of the QLC media. The pages can be pages for the different wordline, including pages staged and maintained in the internal buffer to wait for the second stage of the program.

At 442, the programming performs a QLC mode pre-program-read (PRE-RD) from WL N−2. At 444, the read from the source mode is specified as a read of the first stage Page 1 for WL N−2 to the SRAM. At 446, the SRAM stores the first stage Page 1, identified as Page 1*a*. At 448, the SRAM stages Page 1*a* for write, and the NVM media loads Page 1*a* to the internal buffer. At 450, the programming performs a QLC mode pre-program-read (PRE-RD) from WL N−2. At 452, the read from the source mode is specified as a read of the first stage Page 2 for WL N−2 to the SRAM. At 454, the SRAM stores the first stage Page 2, identified as Page 2*a*. At 456, the SRAM stages Page 2*a* for write, and the NVM media loads Page 2*a* to the internal buffer.

In one example, at 458, the firmware (FW) triggers a program from the internal buffer to the QLC mode media. At 460, the programming performs a QLC mode second stage write to WL N−2. The program will be the upper pages and the lower pages, LP, UP, XP, and TP of WL N−2 of the QLC mode media.

Figure 5:
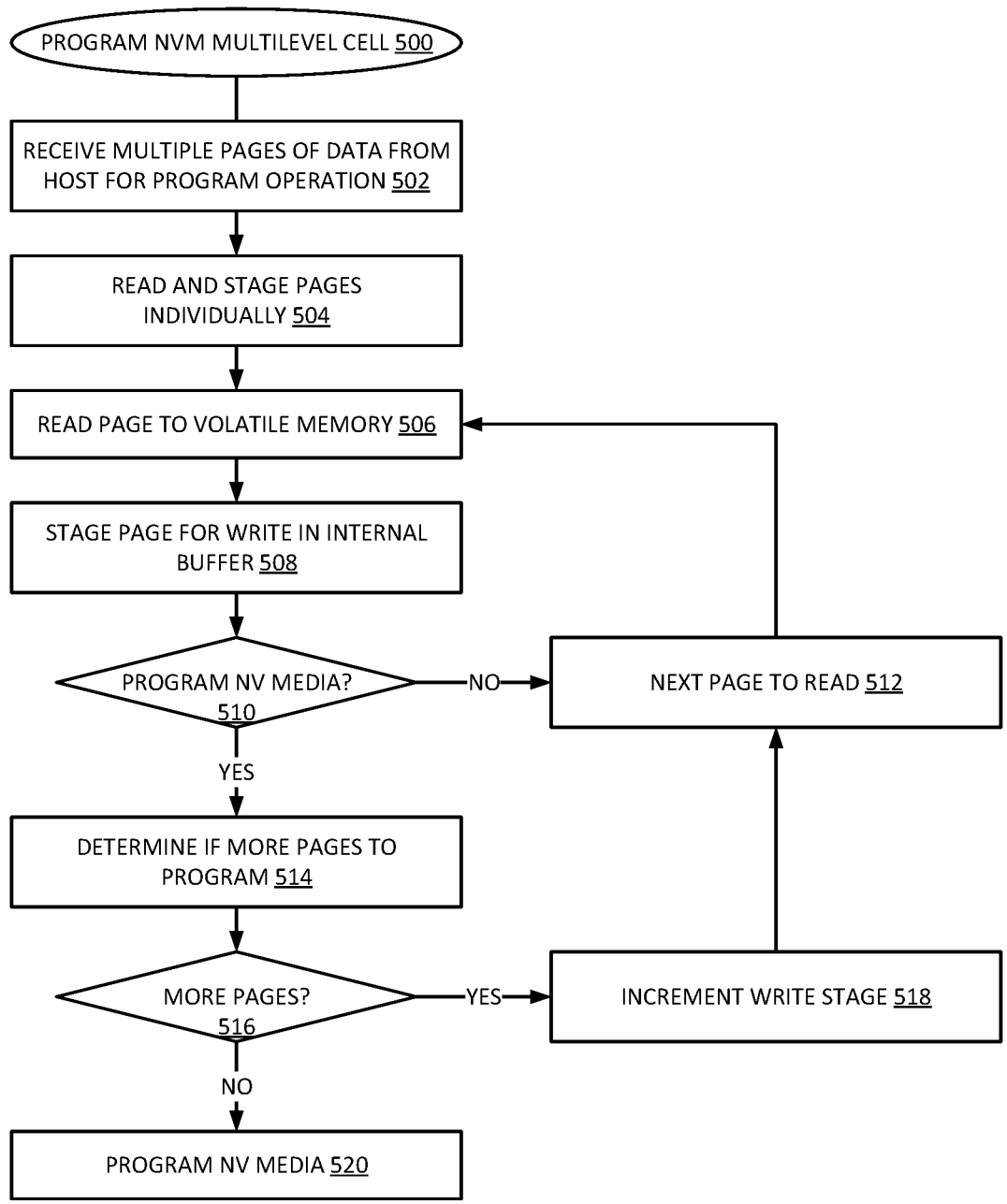
FIG. 5 is a flow diagram of an example of a process for programming a multilevel cell nonvolatile memory.

FIG. 5 is a flow diagram of an example of a process for programming a multilevel cell nonvolatile memory. Process 500 illustrates an example of a process for programming an NVM multilevel cell. In one example, an NVM die receives multiple pages of data from the host for a program operation, at 502. In one example, the NVM die will read and stage the pages individually for program to the destination NVM media, at 504.

The NVM die controller can stage a page for write in the internal buffer for the NVM die destination media, at 508. If the controller is not ready to program the NV media, at 510 YES NO branch, the controller can identify the next page to read from the source media, at 512, and return to read the next page to volatile memory, at 506. In one example, the controller determines to program the NV media based on whether a flush trigger or program trigger has been received. A program trigger can be the loading of a new address for write. The program trigger can be the receipt of a command to indicate the program operation.

If the controller is to program the NV media, at 510 YES branch, in one example, the controller determines if there are more pages to program during this program pass, at 514. In one example, if there are more pages to program, at 516 YES branch, the controller can increment the write stage and return to the programming operations, at 518. There can be more pages to program if there is another stage to a program. The controller can then identify the next page to read, at 512, and return to read the next page to the volatile memory, at 516.

In one example, if there are no more pages to the data to be written to the NV media, at 516 NO branch, the entire page is staged in the internal buffer and the controller is ready to program the NV media. The media controller can program the NV media with the pages of data, at 520.

Figure 6A:
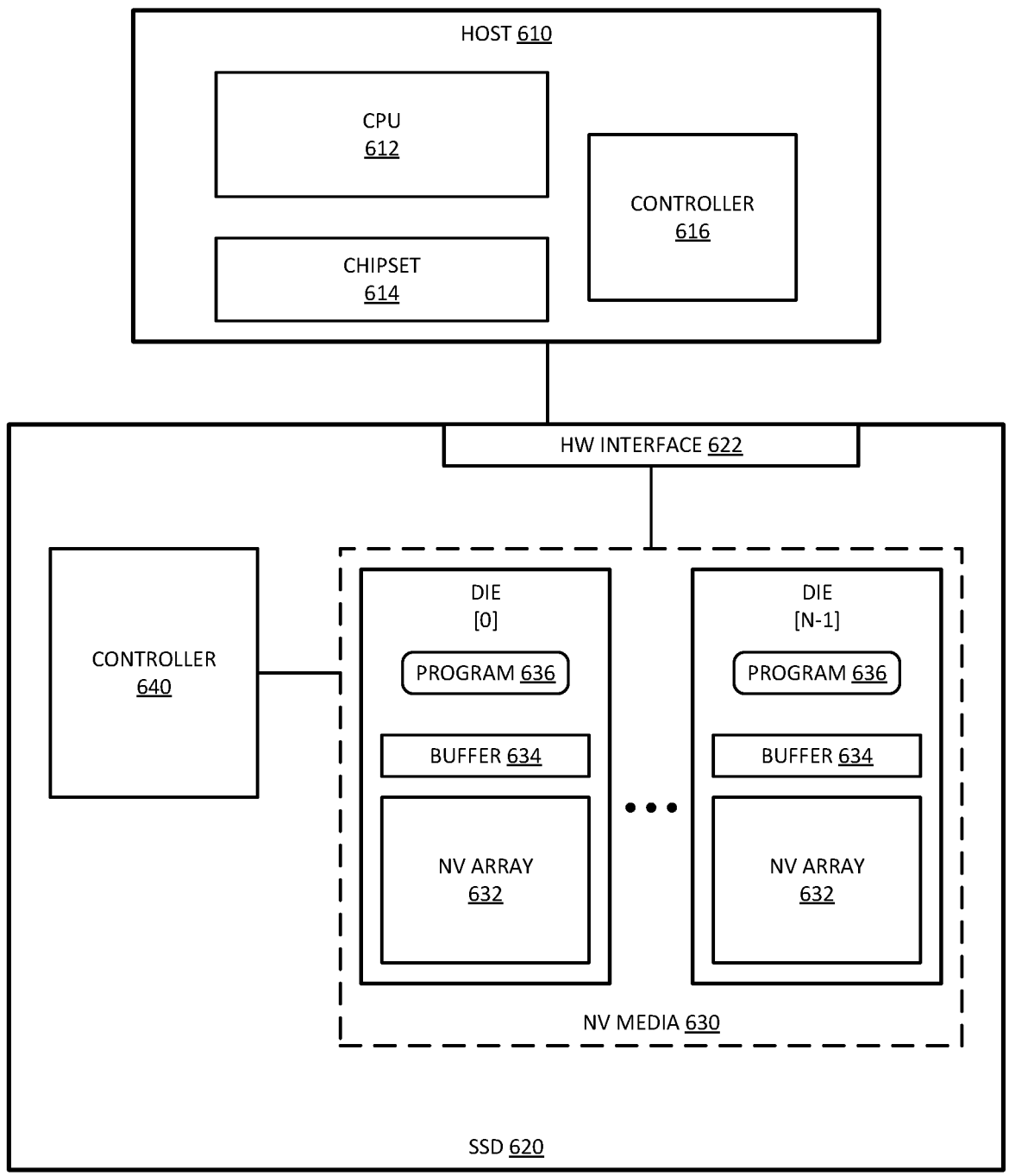
FIG. 6A is a block diagram of an example of a system with a hardware view of a solid state drive (SSD) with a nonvolatile array having an internal buffer for a multistage program operation.

FIG. 6A is a block diagram of an example of a system with a hardware view of a solid state drive (SSD) with a nonvolatile array having an internal buffer for a multistage program operation. System 602 represents components of a nonvolatile storage system that can implement a multistage program operation in accordance with programming 400. System 602 can include an NVM die in accordance with an example of system 200 or an example of NVM die 300.

System 602 includes SSD 620 coupled with host 610. Host 610 represents a host hardware platform that connects to SSD 620. Host 610 includes CPU (central processing unit) 612 or other processor as a host processor or host processor device. CPU 612 represents any host processor that generates requests to access data stored on SSD 620, either to read the data or to write data to the storage. Such a processor can include a single or multicore processor, a primary processor for a computing device, a graphics processor, a peripheral processor, or a supplemental or auxiliary processor, or a combination. CPU 612 can execute a host OS and other applications to cause the operation of system 602.

Host 610 includes chipset 614, which represents hardware components that can be included in connecting between CPU 612 and SSD 620. For example, chipset 614 can include interconnect circuits and logic to enable access to SSD 620. Thus, host platform 610 can include a hardware platform drive interconnect to couple SSD 620 to host 610. Host 610 includes hardware to interconnect to the SSD. Likewise, SSD 620 includes corresponding hardware to interconnect to host 610.

Host 610 includes controller 616, which represents a storage controller or memory controller on the host side to control access to SSD 620. In one example, controller 616 is included in chipset 614. In one example, controller 616 is included in CPU 612. Controller 616 can be referred to as an NV memory controller to enable host 610 to schedule and organize commands to SSD 620 to read and write data.

SSD 620 represents a solid-state drive or other storage system or module that includes nonvolatile (NV) media 630 to store data. SSD 620 includes HW (hardware) interface 622, which represents hardware components to interface with host 610. For example, HW interface 622 can interface with one or more buses to implement a high speed interface standard such as NVMe (nonvolatile memory express) or PCIe (peripheral component interconnect express).

In one example, SSD 620 includes NV (nonvolatile) media 630 as the primary storage for SSD 620. In one example, NV media 630 is or includes a block addressable memory technology, such as NAND (not AND) or NOR (not OR). In one example, NV media 630 can include a nonvolatile block addressable media, a nonvolatile byte addressable media, or a nonvolatile media that can be byte addressable or block addressable. In one example, the nonvolatile media stores data based on a resistive state of the memory cell, or a phase of the memory cell. For example, NV media 630 can be or include a three dimensional crosspoint (3DXP) memory or a storage array based on chalcogenide phase change material (e.g., chalcogenide glass). In one example, the NV media can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory. In one example, NV media 630 includes 3D NAND cells.

In one example, NV media 630 is implemented as multiple dies, illustrated as N dies, Die[0:(N−1)]. N can be any number of devices, and is often a binary number. SSD 620 includes controller 640 to control access to NV media 630 through HW interface 622. Controller 640 represents hardware and control logic within SSD 620 to execute control over the media. Controller 640 is internal to the nonvolatile storage device or module, and is separate from controller 616 of host 610.

In one example, Die[0:(N−1)] include NV array 632. In one example, NV array 632 is a 3D memory array. NV array 632 includes associated buffer 634, which represents an internal buffer for reading and writing to NV array 632. In one example, control of reading and writing into buffer 634 and storing data from buffer 634 into NV array 632 can enable the application of programming to the NV media with minimal external resource use, in accordance with any example of programming described. Program 636 represents the control logic to implement the programming. In one example, program 636 represents control logic as implemented with a controller that manages the programming of the NV media.

Figure 6B:
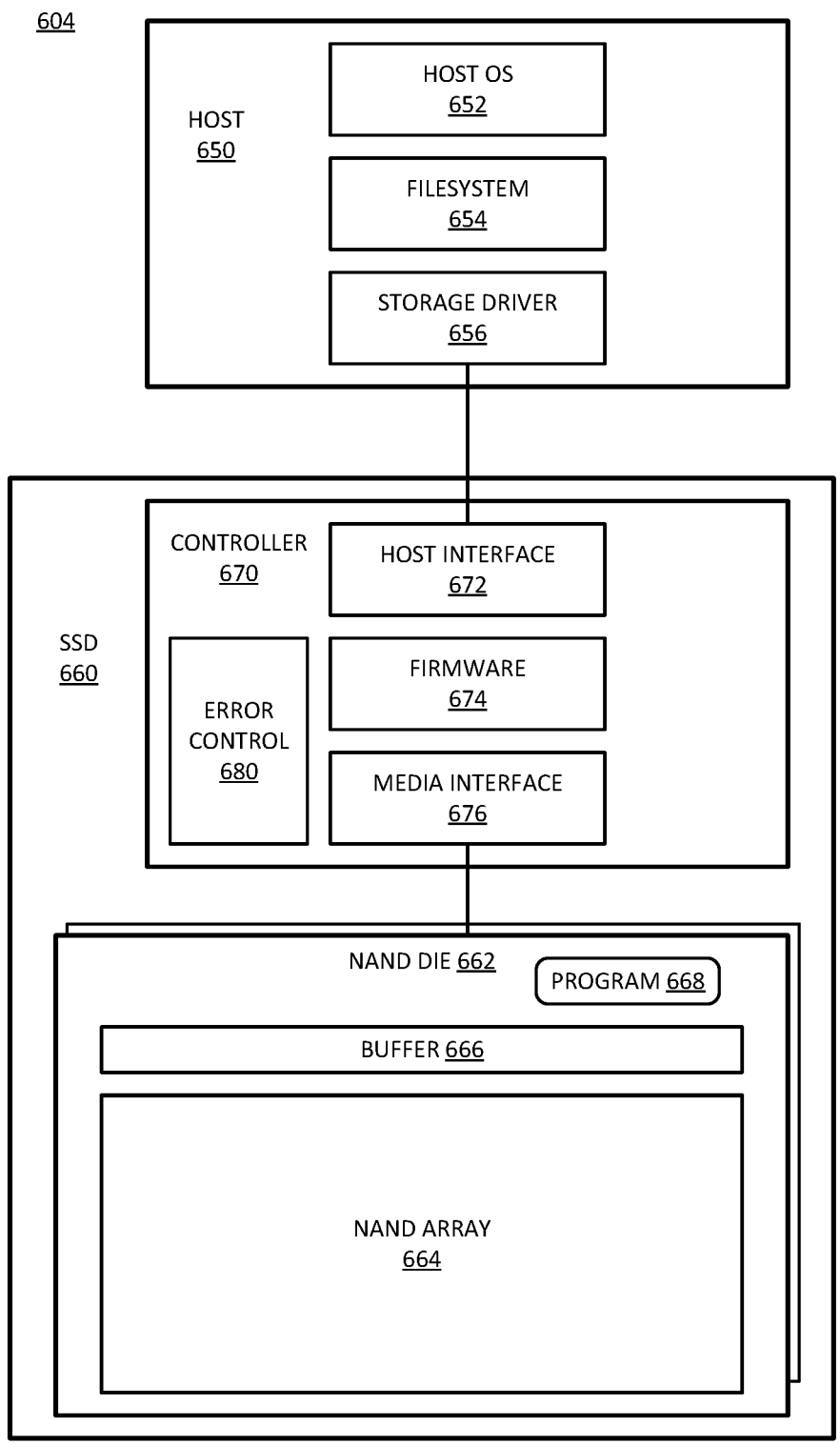
FIG. 6B is a block diagram of an example of a logical view of system with a solid state drive (SSD) with a nonvolatile array having an internal buffer for a multistage program operation.

FIG. 6B is a block diagram of an example of a logical view of system with a solid state drive (SSD) with a nonvolatile array having an internal buffer for a multistage program operation. System 604 illustrates a system with a nonvolatile memory array in accordance with an example of system 602 of FIG. 6A.

System 604 illustrates the logical layers of the host and SSD of a hardware platform in accordance with system 602. System 604 can represent software and firmware components of an example of system 602, as well as physical components. In one example, host 650 provides one example of host 610. In one example, SSD 660 provides one example of SSD 620.

In one example, host 650 includes host OS 652, which represents a host operating system or software platform for the host. Host OS 652 can include a platform on which applications, services, agents, and/or other software executes, and is executed by a processor. Filesystem 654 represents control logic for controlling access to the NV media. Filesystem 654 can manage what addresses or memory locations are used to store what data. There are numerous filesystems known, and filesystem 654 can implement known filesystems or other proprietary systems. In one example, filesystem 654 is part of host OS 652.

Storage driver 656 represents one or more system-level modules that control the hardware of host 650. In one example, drivers 656 include a software application to control the interface to SSD 660, and thus control the hardware of SSD 660. Storage driver 656 can provide a communication interface between the host and the SSD.

Controller 670 of SSD 660 includes firmware 674, which represents control software/firmware for the controller. In one example, controller 670 includes host interface 672, which represents an interface to host 650. In one example, controller 670 includes media interface 676, which represents an interface to NAND die 662. NAND die 662 represents a specific example of NV media, and includes an associated NAND array 664. NAND array 664 includes an array of memory cells.

Media interface 676 represent control that is executed on hardware of controller 670. It will be understood that controller 670 includes hardware to interface with host 650, which can be considered to be controlled by host interface software/firmware 674. Likewise, it will be understood that controller 670 includes hardware to interface with NAND die 662. In one example, code for host interface 672 can be part of firmware 674. In one example, code for media interface 676 can be part of firmware 674.

In one example, controller 670 includes error control 680 to handle data errors in accessed data, and corner cases in terms of compliance with signaling and communication interfacing. Error control 680 can include implementations in hardware or firmware, or a combination of hardware and software.

In one example, NAND die 662 buffer 666, which represents an internal buffer for reading and writing to NAND array 664. In one example, control of reading and writing into buffer 666 and storing data from buffer 666 into NAND array 664 can enable the application of programming to the NV media with minimal external resource use, in accordance with any example of programming described. Program 668 represents the control logic to implement the programming. In one example, program 668 represents control logic as implemented with a controller that manages the programming of the NV media.

Figure 7:
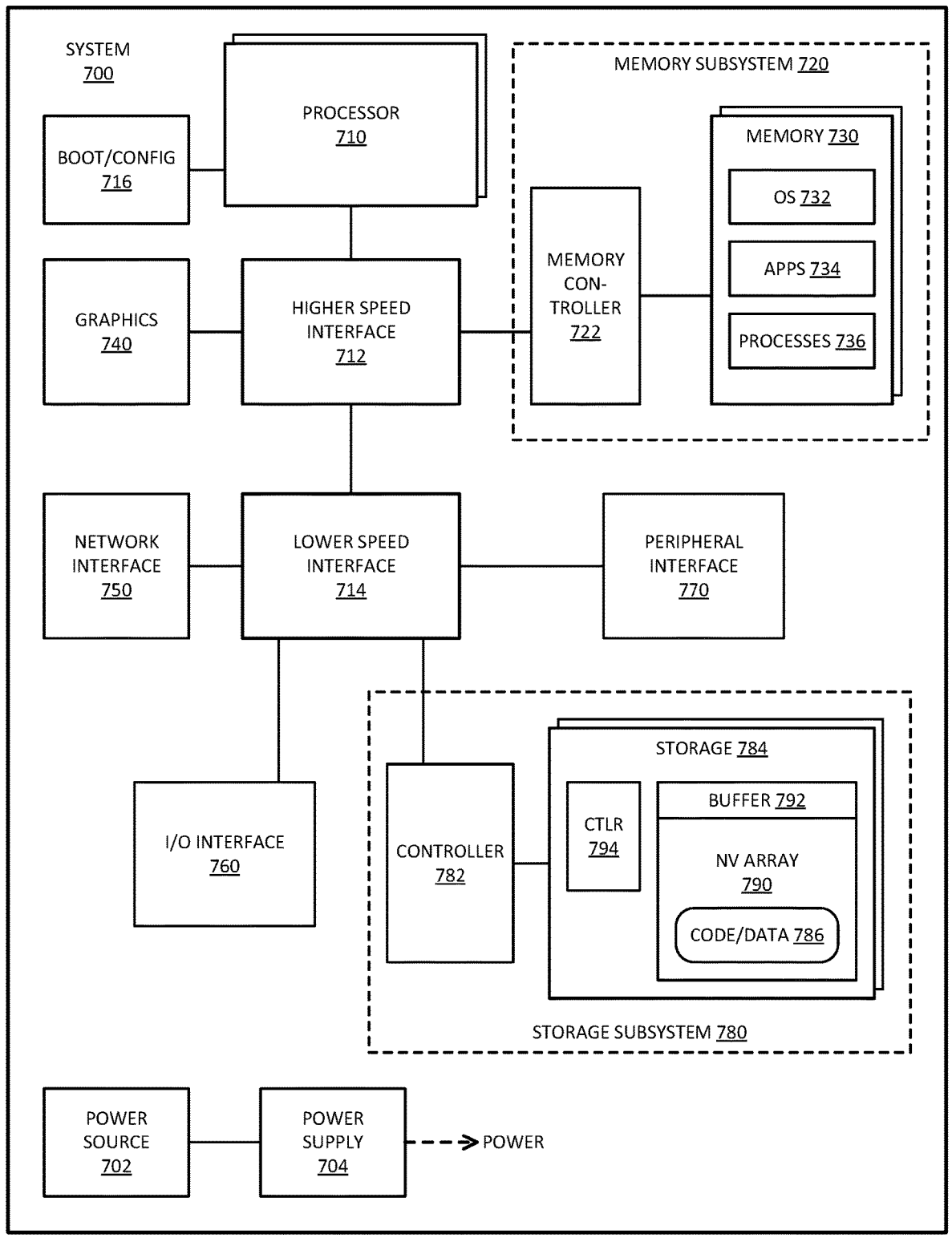
FIG. 7 is a block diagram of an example of a computing system in which a nonvolatile array having an internal buffer for a multistage program operation can be implemented.

FIG. 7 is a block diagram of an example of a computing system in which a nonvolatile array having an internal buffer for a multistage program operation can be implemented. System 700 represents a computing device in accordance with any example herein, and can be a laptop computer, a desktop computer, a tablet computer, a server, a gaming or entertainment control system, embedded computing device, or other electronic device.

In one example, storage subsystem 780 includes storage 784 with NV array 790 to store code/data 786. In one example, NV array 790 includes associated buffer 792. In one example, storage 784 includes controller (CTLR) 794, which represents an on-die controller to manage the programming of NV array 790 utilizing buffer 792 to avoid the use of external buffering of data. In one example, controller 794 can control of reading and writing into buffer 792 and storing data from buffer 792 into NV array 790 to perform programming with minimal external resource use, in accordance with any example of programming described.

System 700 includes processor 710 can include any type of microprocessor, central processing unit (CPU), graphics processing unit (GPU), processing core, or other processing hardware, or a combination, to provide processing or execution of instructions for system 700. Processor 710 can be a host processor device. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or a combination of such devices.

System 700 includes boot/config 716, which represents storage to store boot code (e.g., basic input/output system (BIOS)), configuration settings, security hardware (e.g., trusted platform module (TPM)), or other system level hardware that operates outside of a host OS. Boot/config 716 can include a nonvolatile storage device, such as read-only memory (ROM), flash memory, or other memory devices.

In one example, system 700 includes interface 712 coupled to processor 710, which can represent a higher speed interface or a high throughput interface for system components that need higher bandwidth connections, such as memory subsystem 720 or graphics interface components 740. Interface 712 represents an interface circuit, which can be a standalone component or integrated onto a processor die. Interface 712 can be integrated as a circuit onto the processor die or integrated as a component on a system on a chip. Where present, graphics interface 740 interfaces to graphics components for providing a visual display to a user of system 700. Graphics interface 740 can be a standalone component or integrated onto the processor die or system on a chip. In one example, graphics interface 740 can drive a high definition (HD) display or ultra high definition (UHD) display that provides an output to a user. In one example, the display can include a touchscreen display. In one example, graphics interface 740 generates a display based on data stored in memory 730 or based on operations executed by processor 710 or both.

Memory subsystem 720 represents the main memory of system 700, and provides storage for code to be executed by processor 710, or data values to be used in executing a routine. Memory subsystem 720 can include one or more varieties of random-access memory (RAM) such as DRAM, 3DXP (three-dimensional crosspoint), or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710, such as integrated onto the processor die or a system on a chip.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 700 includes interface 714, which can be coupled to interface 712. Interface 714 can be a lower speed interface than interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, 3DXP, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one example, storage subsystem 780 includes controller 782 to interface with storage 784. In one example controller 782 is a physical part of interface 714 or processor 710, or can include circuits or logic in both processor 710 and interface 714.

Power source 702 provides power to the components of system 700. More specifically, power source 702 typically interfaces to one or multiple power supplies 704 in system 700 to provide power to the components of system 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 or power supply 704 includes wireless charging hardware to charge via proximity to a charging field. In one example, power source 702 can include an internal battery or fuel cell source.

Figure 8:
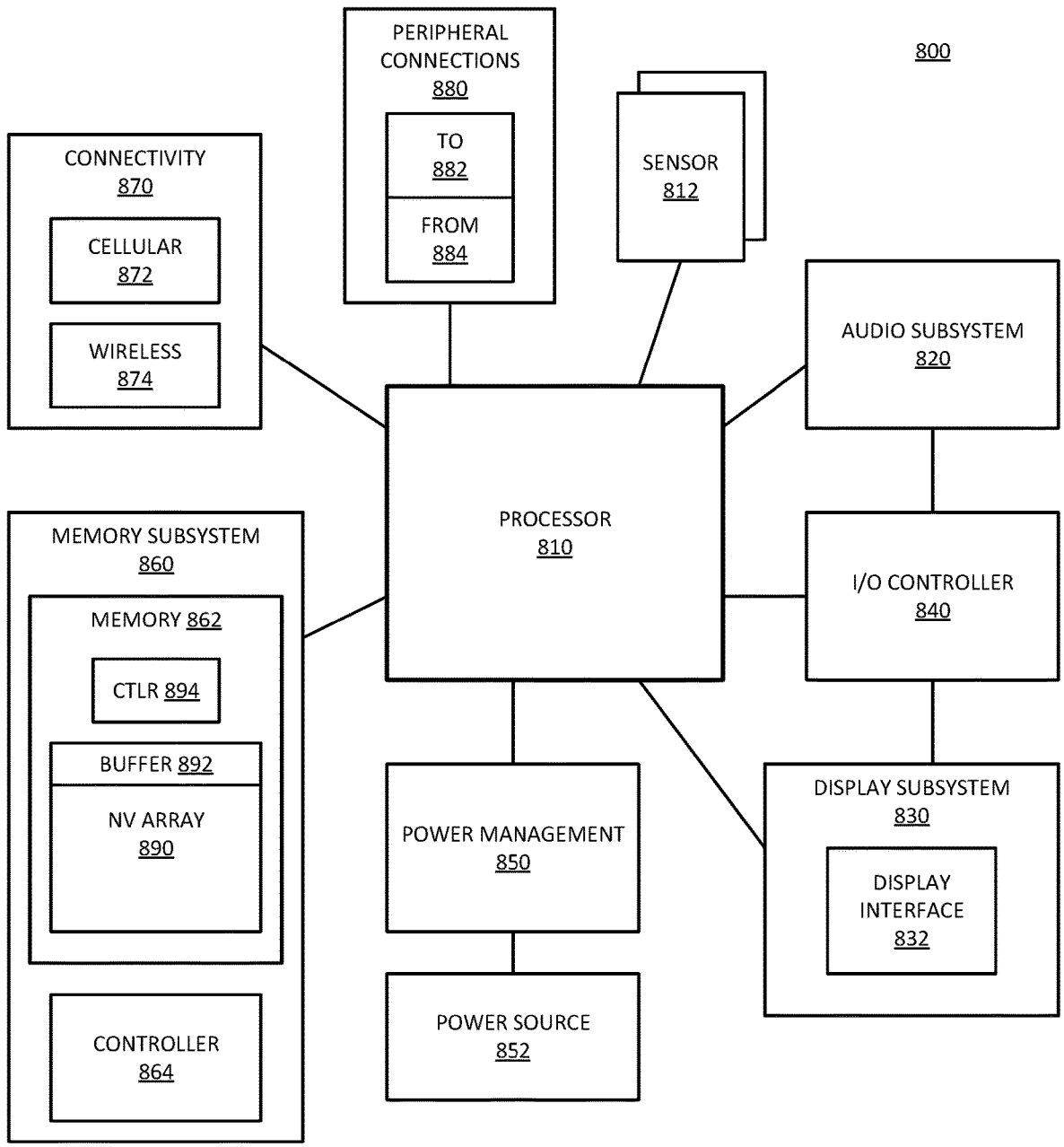
FIG. 8 is a block diagram of an example of a mobile device in which a nonvolatile array having an internal buffer for a multistage program operation can be implemented.

FIG. 8 is a block diagram of an example of a mobile device in which a nonvolatile array having an internal buffer for a multistage program operation can be implemented. System 800 represents a mobile computing device, such as a computing tablet, a mobile phone or smartphone, wearable computing device, or other mobile device, or an embedded computing device. It will be understood that certain of the components are shown generally, and not all components of such a device are shown in system 800.

In one example, memory subsystem 860 includes memory 862 with NV array 890. In one example, NV array 890 includes associated buffer 892. In one example, memory 862 includes controller (CTLR) 894, which represents an on-die controller to manage the programming of NV array 890 utilizing buffer 892 to avoid the use of external buffering of data. In one example, controller 894 can control of reading and writing into buffer 892 and storing data from buffer 892 into NV array 890 to perform programming with minimal external resource use, in accordance with any example of programming described.

System 800 includes processor 810, which performs the primary processing operations of system 800. Processor 810 can be a host processor device. Processor 810 can include one or more physical devices, such as microprocessors, application processors, microcontrollers, programmable logic devices, or other processing means. The processing operations performed by processor 810 include the execution of an operating platform or operating system on which applications and device functions are executed. The processing operations include operations related to I/O (input/output) with a human user or with other devices, operations related to power management, operations related to connecting system 800 to another device, or a combination. The processing operations can also include operations related to audio I/O, display I/O, or other interfacing, or a combination. Processor 810 can execute data stored in memory. Processor 810 can write or edit data stored in memory.

In one example, system 800 includes one or more sensors 812. Sensors 812 represent embedded sensors or interfaces to external sensors, or a combination. Sensors 812 enable system 800 to monitor or detect one or more conditions of an environment or a device in which system 800 is implemented. Sensors 812 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 812 can also include sensors for biometric systems such as fingerprint recognition systems, face detection or recognition systems, or other systems that detect or recognize user features. Sensors 812 should be understood broadly, and not limiting on the many different types of sensors that could be implemented with system 800. In one example, one or more sensors 812 couples to processor 810 via a frontend circuit integrated with processor 810. In one example, one or more sensors 812 couples to processor 810 via another component of system 800.

In one example, system 800 includes audio subsystem 820, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 800, or connected to system 800. In one example, a user interacts with system 800 by providing audio commands that are received and processed by processor 810.

Display subsystem 830 represents hardware (e.g., display devices) and software components (e.g., drivers) that provide a visual display for presentation to a user. In one example, the display includes tactile components or touchscreen elements for a user to interact with the computing device. Display subsystem 830 includes display interface 832, which includes the particular screen or hardware device used to provide a display to a user. In one example, display interface 832 includes logic separate from processor 810 (such as a graphics processor) to perform at least some processing related to the display. In one example, display subsystem 830 includes a touchscreen device that provides both output and input to a user. In one example, display subsystem 830 includes a high definition (HD) or ultra-high definition (UHD) display that provides an output to a user.

In one example, display subsystem includes or drives a touchscreen display. In one example, display subsystem 830 generates display information based on data stored in memory or based on operations executed by processor 810 or both.

I/O controller 840 represents hardware devices and software components related to interaction with a user. I/O controller 840 can operate to manage hardware that is part of audio subsystem 820, or display subsystem 830, or both. Additionally, I/O controller 840 illustrates a connection point for additional devices that connect to system 800 through which a user might interact with the system. For example, devices that can be attached to system 800 might include microphone devices, speaker or stereo systems, video systems or other display device, keyboard or keypad devices, buttons/switches, or other I/O devices for use with specific applications such as card readers or other devices.

As mentioned above, I/O controller 840 can interact with audio subsystem 820 or display subsystem 830 or both. For example, input through a microphone or other audio device can provide input or commands for one or more applications or functions of system 800. Additionally, audio output can be provided instead of or in addition to display output. In another example, if display subsystem includes a touchscreen, the display device also acts as an input device, which can be at least partially managed by I/O controller 840. There can also be additional buttons or switches on system 800 to provide I/O functions managed by I/O controller 840.

In one example, I/O controller 840 manages devices such as accelerometers, cameras, light sensors or other environmental sensors, gyroscopes, global positioning system (GPS), or other hardware that can be included in system 800, or sensors 812. The input can be part of direct user interaction, as well as providing environmental input to the system to influence its operations (such as filtering for noise, adjusting displays for brightness detection, applying a flash for a camera, or other features).

In one example, system 800 includes power management 850 that manages battery power usage, charging of the battery, and features related to power saving operation. Power management 850 manages power from power source 852, which provides power to the components of system 800. In one example, power source 852 includes an AC to DC (alternating current to direct current) adapter to plug into a wall outlet. Such AC power can be renewable energy (e.g., solar power, motion based power). In one example, power source 852 includes only DC power, which can be provided by a DC power source, such as an external AC to DC converter. In one example, power source 852 includes wireless charging hardware to charge via proximity to a charging field. In one example, power source 852 can include an internal battery or fuel cell source.

Memory subsystem 860 includes memory device(s) 862 for storing information in system 800. Memory subsystem 860 can include nonvolatile (state does not change if power to the memory device is interrupted) or volatile (state is indeterminate if power to the memory device is interrupted) memory devices, or a combination. Memory 860 can store application data, user data, music, photos, documents, or other data, as well as system data (whether long-term or temporary) related to the execution of the applications and functions of system 800. In one example, memory subsystem 860 includes memory controller 864 (which could also be considered part of the control of system 800, and could potentially be considered part of processor 810). Memory controller 864 includes a scheduler to generate and issue commands to control access to memory device 862.

Connectivity 870 includes hardware devices (e.g., wireless or wired connectors and communication hardware, or a combination of wired and wireless hardware) and software components (e.g., drivers, protocol stacks) to enable system 800 to communicate with external devices. The external device could be separate devices, such as other computing devices, wireless access points or base stations, as well as peripherals such as headsets, printers, or other devices. In one example, system 800 exchanges data with an external device for storage in memory or for display on a display device. The exchanged data can include data to be stored in memory, or data already stored in memory, to read, write, or edit data.

Connectivity 870 can include multiple different types of connectivity. To generalize, system 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 874 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that system 800 could both be a peripheral device ("to" 882) to other computing devices, as well as have peripheral devices ("from" 884) connected to it. System 800 commonly has a "docking" connector to connect to other computing devices for purposes such as managing (e.g., downloading, uploading, changing, synchronizing) content on system 800. Additionally, a docking connector can allow system 800 to connect to certain peripherals that allow system 800 to control content output, for example, to audiovisual or other systems.

In addition to a proprietary docking connector or other proprietary connection hardware, system 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example an apparatus includes: a nonvolatile (NV) media having an array of multilevel cells on a media die; a volatile memory on the media die to store data to program the NV media; and a buffer on the media die to buffer read and program data for the NV media; wherein a program of the NV media is to stage first partial pages in the buffer for program, read second partial pages from the NV media to the volatile memory, store second partial pages in the buffer, and program the NV media with the first partial pages and the second partial pages.

In one example of the apparatus, the program of the NV media comprises garbage collection to move data from a source media to the NV media. In accordance with any preceding example of the apparatus, in one example, the source media comprises a single level cell (SLC) flash memory, or in one example, the source media comprises a three level cell (TLC) flash memory, or in one example, the source media comprises a quad level cell (QLC) flash memory, or in one example, the source media comprises a three-dimensional crosspoint (3DXP) memory, or in one example, the source media comprises a dynamic random access memory (DRAM). In accordance with any preceding example of the apparatus, in one example, to read the second partial pages to the volatile memory comprises performance of error checking and correction (ECC) on the second partial pages. In accordance with any preceding example of the apparatus, in one example, program the NV media comprises flush the first partial pages and the second partial pages from the buffer to the NV media in response to loading of a new address to program in the NV media. In accordance with any preceding example of the apparatus, in one example, program the NV media comprises flush the first partial pages and the second partial pages from the buffer to the NV media in response to a flush command. In accordance with any preceding example of the apparatus, in one example, the buffer comprises read/write registers for the NV media. In accordance with any preceding example of the apparatus, in one example, the NV media comprises a quad level cell (QLC) flash memory, or in one example, the NV media comprises a three level cell (TLC) flash memory, or in one example, the NV media comprises a five level cell (5LC) flash memory, or in one example, the NV media comprises a three-dimensional crosspoint (3DXP) memory. In accordance with any preceding example of the apparatus, in one example, the volatile memory comprises a static random access memory (SRAM).

In general with respect to the descriptions herein, in one example a computing device includes: a host processor; and a solid state drive (SSD) coupled to the host processor, the SSD including a nonvolatile (NV) media having an array of multilevel cells on a media die; a volatile memory on the media die to store data to program the NV media; and a buffer on the media die to buffer read and program data for the NV media; wherein a program of the NV media is to stage first partial pages in the buffer for program, read second partial pages from the NV media to the volatile memory, store second partial pages in the buffer, and program the NV media with the first partial pages and the second partial pages.

In one example of the computing device, the program of the NV media comprises garbage collection to move data from a source media to the NV media. In accordance with any preceding example of the computing device, in one example, the source media comprises a single level cell (SLC) flash memory, or in one example, the source media comprises a three level cell (TLC) flash memory, or in one example, the source media comprises a quad level cell (QLC) flash memory, or in one example, the source media comprises a three-dimensional crosspoint (3DXP) memory, or in one example, the source media comprises a dynamic random access memory (DRAM). In accordance with any preceding example of the computing device, in one example, to read the second partial pages to the volatile memory comprises performance of error checking and correction (ECC) on the second partial pages. In accordance with any preceding example of the computing device, in one example, program the NV media comprises flush the first partial pages and the second partial pages from the buffer to the NV media in response to loading of a new address to program in the NV media. In accordance with any preceding example of the computing device, in one example, program the NV media comprises flush the first partial pages and the second partial pages from the buffer to the NV media in response to a flush command. In accordance with any preceding example of the computing device, in one example, the buffer comprises read/write registers for the NV media. In accordance with any preceding example of the computing device, in one example, the NV media comprises a quad level cell (QLC) flash memory, or in one example, the NV media comprises a three level cell (TLC) flash memory, or in one example, the NV media comprises a five level cell (5LC) flash memory, or in one example, the NV media comprises a three-dimensional crosspoint (3DXP) memory. In accordance with any preceding example of the computing device, in one example, the volatile memory comprises a static random access memory (SRAM). In accordance with any preceding example of the computing device, in one example, the computing device includes: a display communicatively coupled to the host processor; a network interface communicatively coupled to the host processor; or a battery to power the computing device.

In general with respect to the descriptions herein, in one example method includes: on a volatile memory, the volatile memory on a media die with a nonvolatile (NV) media having an array of multilevel cells; storing data to program the NV media; buffering read and program data for the NV media with a buffer on the media die; programming the NV media including staging first partial pages in the buffer for program, reading second partial pages from the NV media to the volatile memory, storing second partial pages in the buffer, and programming the NV media with the first partial pages and the second partial pages.

In one example of the method, programming the NV media comprises performing garbage collection to move data from a source media to the NV media. In accordance with any preceding example of the method, in one example, the source media comprises a single level cell (SLC) flash memory, or in one example, the source media comprises a three level cell (TLC) flash memory, or in one example, the source media comprises a quad level cell (QLC) flash memory, or in one example, the source media comprises a three-dimensional crosspoint (3DXP) memory, or in one example, the source media comprises a dynamic random access memory (DRAM). In accordance with any preceding example of the method, in one example, reading the second partial pages to the volatile memory comprises performing error checking and correction (ECC) on the second partial pages. In accordance with any preceding example of the method, in one example, programming the NV media comprises flushing the first partial pages and the second partial pages from the buffer to the NV media in response to loading of a new address to program in the NV media. In accordance with any preceding example of the method, in one example, programming the NV media comprises flushing the first partial pages and the second partial pages from the buffer to the NV media in response to a flush command. In accordance with any preceding example of the method, in one example, the buffer comprises read/write registers for the NV media. In accordance with any preceding example of the method, in one example, the NV media comprises a quad level cell (QLC) flash memory, or in one example, the NV media comprises a three level cell (TLC) flash memory, or in one example, the NV media comprises a five level cell (5LC) flash memory, or in one example, the NV media comprises a three-dimensional crosspoint (3DXP) memory. In accordance with any preceding example of the method, in one example, the volatile memory comprises a static random access memory (SRAM).

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:
1. An apparatus comprising:
a nonvolatile (NV) media having an array of multilevel cells on a media die;
a buffer on the media die to buffer read data and program data for the NV media during a read operation and during a program operation, respectively, the buffer comprising a plurality of registers that each stores a partial page of data; and a volatile memory on the media die, separate from the buffer, to read first partial pages for the program operation and stage the first partial pages in registers of the buffer, and subsequently read second partial pages for the program operation and stage the second partial pages in registers of the buffer with the first partial pages, wherein the first partial pages and the second partial pages are stored in separate registers and make up the program data for a multilevel cell of the media die, wherein the buffer is to flush the first partial pages and the second partial pages to the NV media to program the NV media.

2. The apparatus of claim 1, wherein the program of the NV media comprises garbage collection to move data from a source media to the NV media.

3. The apparatus of claim 2, wherein the source media comprises a single level cell (SLC) flash memory.

4. The apparatus of claim 2, wherein the source media comprises one of a three level cell (TLC) flash memory, a quad level cell (QLC) flash memory, or a three-dimensional crosspoint (3DXP) memory.

5. The apparatus of claim 2, wherein the source media comprises a dynamic random access memory (DRAM).

6. The apparatus of claim 1, wherein to read the second partial pages to the volatile memory comprises performance of error checking and correction (ECC) on the second partial pages.

7. The apparatus of claim 1, wherein program the NV media comprises flush the first partial pages and the second partial pages from the buffer to the NV media in response to loading of a new address to program in the NV media.

8. The apparatus of claim 1, wherein program the NV media comprises flush the first partial pages and the second partial pages from the buffer to the NV media in response to a flush command.

9. The apparatus of claim 1, wherein the buffer comprises read/write registers for the NV media.

10. The apparatus of claim 1, wherein the NV media comprises quad level cell (QLC) flash memory.

11. The apparatus of claim 1, wherein the NV media comprises one of a three level cell (TLC) flash memory, five level cell (5LC) flash memory, or a three-dimensional crosspoint (3DXP) memory.

12. The apparatus of claim 1, wherein the volatile memory comprises a static random access memory (SRAM).

13. A computing device comprising:
a host processor; and
a solid state drive (SSD) coupled to the host processor, the SSD including
a nonvolatile (NV) media having an array of multilevel cells on a media die;
a volatile memory on the media die to store data to program the NV media; and
a buffer on the media die, separate from the volatile memory, to buffer read data and program data for the NV media during a read operation and during a program operation, respectively;
wherein the volatile memory is to read first partial pages from a source media for the program operation and stage the first partial pages in the buffer, then read second partial pages from the source media and stage the second partial pages in the buffer with the first partial pages, wherein the first partial pages and the second partial pages make up the program data for a multilevel cell of the media die, wherein the buffer is to flush the first partial pages and the second partial pages to the NV media to program the NV media.

14. The computing device of claim 13, wherein the program of the NV media comprises garbage collection to move data from a single level cell (SLC) flash buffer memory to the NV media.

15. The computing device of claim 13, wherein to read the second partial pages to the volatile memory comprises performance of error checking and correction (ECC) on the second partial pages.

16. The computing device of claim 13, wherein program the NV media comprises flush the first partial pages and the second partial pages from the buffer to the NV media in response to loading of a new address to program in the NV media.

17. The computing device of claim 13, wherein the buffer comprises a staging buffer for the NV media.

18. The computing device of claim 13, wherein the NV media comprises a quad level cell (QLC) flash memory and wherein the volatile memory comprises a static random access memory (SRAM).

19. The computing device of claim 13, further comprising:
a display communicatively coupled to the host processor;
a network interface communicatively coupled to the host processor; or
a battery to power the computing device.

20. The apparatus of claim 1, wherein the NV media comprises a quad-plane NAND die.

* * * * *